(12) United States Patent
Sasaki

(10) Patent No.: US 10,347,222 B2
(45) Date of Patent: Jul. 9, 2019

(54) MUSICAL SOUND GENERATION METHOD FOR ELECTRONIC WIND INSTRUMENT

(71) Applicant: CASIO COMPUTER CO., LTD., Shibuya-ku, Tokyo (JP)

(72) Inventor: Hiroyuki Sasaki, Ome (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 81 days.

(21) Appl. No.: 15/645,124

(22) Filed: Jul. 10, 2017

(65) Prior Publication Data

US 2018/0082664 A1 Mar. 22, 2018

(30) Foreign Application Priority Data

Sep. 21, 2016 (JP) .................................. 2016-184856

(51) Int. Cl.
| | |
|---|---|
| *G10B 3/22* | (2006.01) |
| *G10H 1/02* | (2006.01) |
| *G10H 1/46* | (2006.01) |
| *G10H 5/00* | (2006.01) |
| *H03F 3/68* | (2006.01) |
| *H03H 7/01* | (2006.01) |

(52) U.S. Cl.
CPC ............... *G10B 3/22* (2013.01); *G10H 1/02* (2013.01); *G10H 1/46* (2013.01); *G10H 5/005* (2013.01); *G10H 5/007* (2013.01); *H03F 3/68* (2013.01); *H03H 7/01* (2013.01); *G10H 2220/361* (2013.01); *G10H 2230/205* (2013.01); *G10H 2230/221* (2013.01); *G10H 2250/471* (2013.01)

(58) Field of Classification Search
CPC ... G10B 3/22; G10H 1/02; G10H 1/46; G10H 5/005; G10H 5/007; G10H 2220/361; G10H 2230/205; G10H 2230/221; G10H 2250/471; H03F 3/68; H03H 7/01
USPC ............................................................ 84/658
See application file for complete search history.

(56) References Cited

U.S. PATENT DOCUMENTS

| 5,117,729 A | * | 6/1992 | Kunimoto | ............... G10H 5/007 84/660 |
|---|---|---|---|---|
| 5,187,313 A | * | 2/1993 | Inoue | ..................... G10H 5/007 84/622 |

(Continued)

FOREIGN PATENT DOCUMENTS

| JP | 06051766 A | | 2/1994 | | |
|---|---|---|---|---|---|
| JP | 09305177 A | * | 11/1997 | ............ | G10H 1/057 |

(Continued)

OTHER PUBLICATIONS

Japanese Office Action dated Oct. 2, 2018 (and English translation thereof) issued in counterpart Japanese Application No. 2016-184856.

*Primary Examiner* — David S Warren
*Assistant Examiner* — Christina M Schreiber
(74) *Attorney, Agent, or Firm* — Holtz, Holtz & Volek PC

(57) ABSTRACT

Calculation is performed to provide a delay and attenuated oscillation to a blowing pressure detected by a blowing pressure sensor which detects blowing pressure, and a musical sound is generated based on the blowing pressure subjected to the calculation. As a result, for example, a blowing feeling of an electronic wind instrument can be made closer to a blowing feeling of a natural musical instrument.

14 Claims, 10 Drawing Sheets

(56) References Cited

U.S. PATENT DOCUMENTS

| | | | | |
|---|---|---|---|---|
| 5,245,130 A * | 9/1993 | Wheaton | | G10H 1/0066 84/377 |
| 5,248,844 A * | 9/1993 | Kunimoto | | G10H 5/007 84/622 |
| 5,272,275 A * | 12/1993 | Kunimoto | | G10H 1/16 331/78 |
| 5,371,317 A * | 12/1994 | Masuda | | G10H 5/007 84/659 |
| 5,408,042 A * | 4/1995 | Masuda | | G10H 1/055 84/661 |
| 5,459,280 A * | 10/1995 | Masuda | | G10H 1/055 84/622 |
| 5,543,580 A * | 8/1996 | Masuda | | G10H 1/055 84/723 |
| 5,786,541 A * | 7/1998 | Komano | | G10H 1/057 84/663 |
| 6,002,080 A * | 12/1999 | Tanaka | | G10D 7/00 84/609 |
| 6,647,359 B1 * | 11/2003 | Verplank | | G10H 3/12 381/119 |
| 6,748,355 B1 * | 6/2004 | Miner | | G10L 13/00 704/203 |
| 6,751,322 B1 * | 6/2004 | Carlbom | | H04S 3/00 381/61 |
| 10,229,663 B2 * | 3/2019 | Smith | | G10H 3/16 |
| 2007/0068372 A1 * | 3/2007 | Masuda | | G10H 1/0008 84/723 |
| 2008/0140378 A1 * | 6/2008 | Sarti | | G06F 17/5009 703/14 |
| 2011/0283869 A1 * | 11/2011 | Johnson | | G09B 15/023 84/622 |
| 2012/0073424 A1 * | 3/2012 | Hashimoto | | G10H 1/0008 84/622 |
| 2013/0192446 A1 * | 8/2013 | Read | | G10H 1/02 84/609 |
| 2015/0348525 A1 * | 12/2015 | Nakae | | G10H 1/0008 84/735 |
| 2016/0275930 A1 * | 9/2016 | Harada | | G10H 1/46 |
| 2018/0082664 A1 * | 3/2018 | Sasaki | | G10B 3/22 |
| 2018/0090120 A1 * | 3/2018 | Kasuga | | G10H 1/043 |

FOREIGN PATENT DOCUMENTS

| | | | | |
|---|---|---|---|---|
| JP | 09305177 A | * | 11/1997 | G10H 1/057 |
| JP | H09305177 A | | 11/1997 | |
| JP | 2000122641 A | | 4/2000 | |
| JP | 2017062359 A | | 3/2017 | |

* cited by examiner

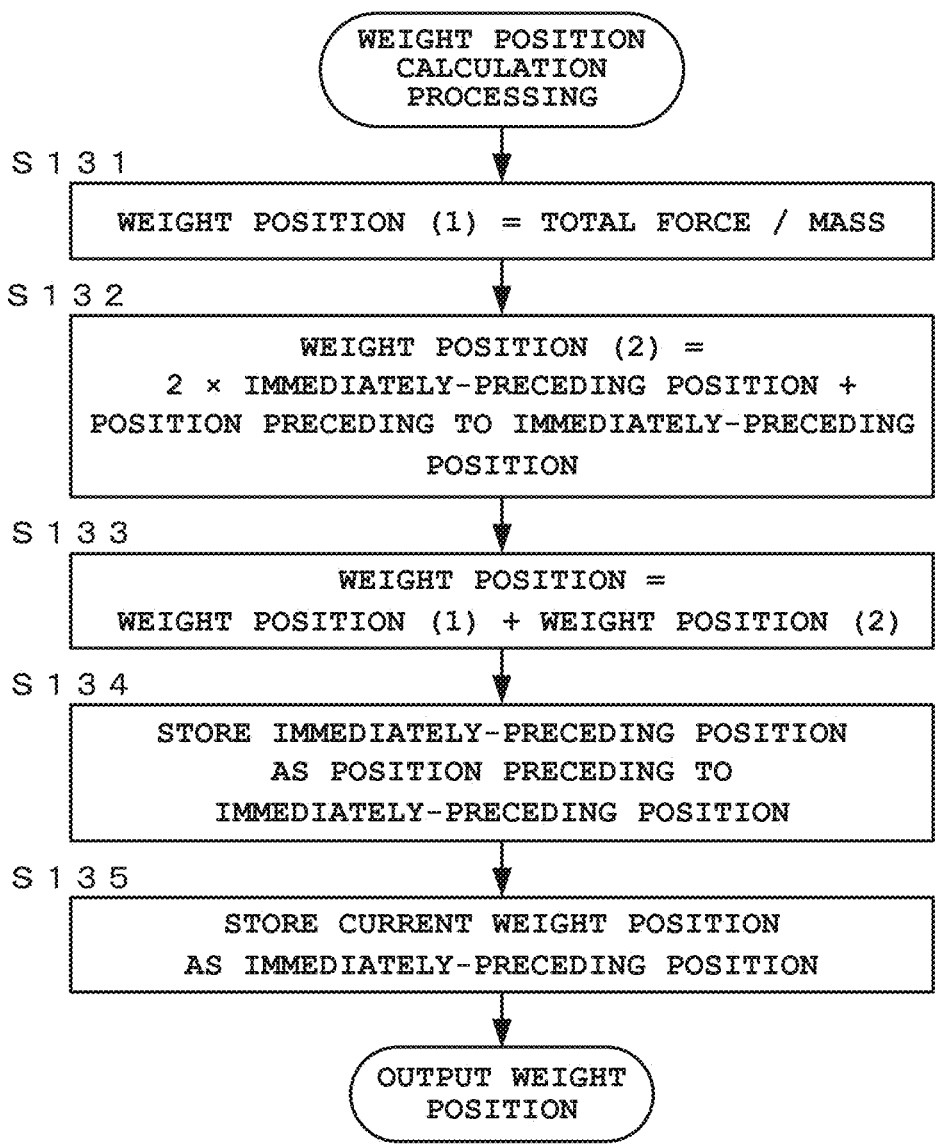

MUSICAL SOUND GENERATION METHOD FOR ELECTRONIC WIND INSTRUMENT

CROSS-REFERENCE TO RELATED APPLICATION

This application is based upon and claims the benefit of priority from the prior Japanese Patent Application No. 2016-184856, filed Sep. 21, 2016, the entire contents of which are incorporated herein by reference.

BACKGROUND OF THE INVENTION

1. Field of the Invention

The present invention relates to musical sound generation technology in electronic wind instruments.

2. Description of the Related Art

Conventionally, electronic wind instruments shaped like acoustic wind instruments such as saxophones and clarinets so as to be played like them have been known. In the musical performance of this type of electronic wind instrument, switches (pitch keys) provided at key positions similar to those of an acoustic wind instrument are operated, whereby the pitch of each musical sound is specified. Also, by the blowing pressure of breath blown into a mouthpiece, the sound volume is controlled. Furthermore, by a lip position, tongue contact status, bite force, and the like when the mouthpiece is in the mouth, the sound tone is controlled.

Accordingly, the mouthpiece of the conventional electronic wind instrument is provided with various sensors for detecting the blowing pressure of breath, lip position, tongue contact status, bite force, and the like during musical performance. An example of this electronic wind instrument provided with various sensors for detecting these statuses during musical performance is described in Japanese Patent Application Laid-Open (Kokai) Publication No. 2000-122641.

SUMMARY OF THE INVENTION

In accordance with one aspect of the present invention, there is provided a musical sound generation method comprising: performing calculation of providing attenuated oscillation to a first blowing pressure detected by a blowing pressure sensor which detects blowing pressure; and generating a musical sound based on a second blowing pressure acquired by the calculation being performed on the first blowing pressure.

In accordance with another aspect of the present invention there is provided a musical sound generation apparatus comprising: a blowing pressure sensor which detects a blowing pressure; a blowing pressure processor which calculates a physical model blowing pressure by performing physical model calculation of providing attenuated oscillation to the blowing pressure detected by the blowing pressure sensor during musical performance; and a musical sound generation processor which generates a musical sound based on the physical model blowing pressure.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIG. 9 is a flowchart showing an example of processing of calculating the weight position of the physical model applied in the embodiment and FIG. 10A and FIG. 10 are diagrams for comparing the change characteristic of a physical model blowing pressure calculated by physical model calculation applied in the embodiment and waveform data representing sound volume changes in a natural musical instrument.

DETAILED DESCRIPTION OF THE PREFERRED EMBODIMENTS

Embodiments of an electronic wind instrument, a musical sound generation apparatus, a musical sound generation method, and a program according to the present invention will hereinafter be described in detail with reference to the drawings.

(Electronic Wind Instrument)

Figure 1:
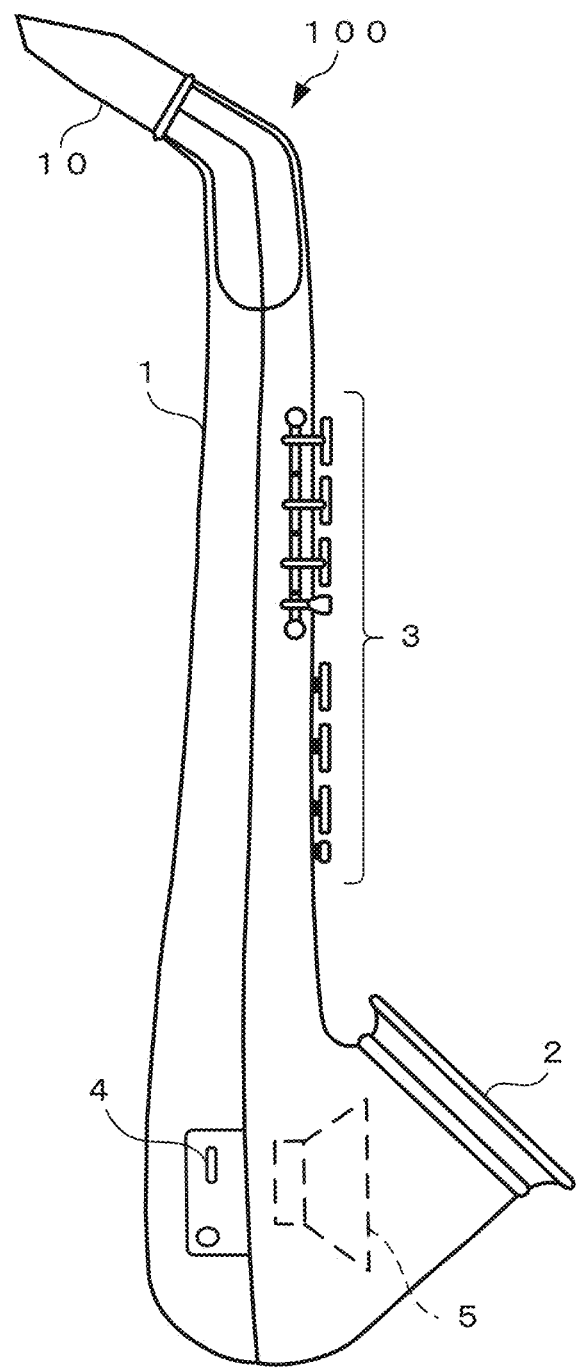
FIG. 1 is an external view showing the entire structure of an electronic wind instrument according to an embodiment of the present invention.

FIG. 1 is an external view showing the entire structure of an electronic wind instrument according to an embodiment of the present invention.

This electronic wind instrument 100 according to the present invention has a shape similar to that of a saxophone which is an acoustic wind instrument, as shown in FIG. 1. On one end side (upper end side in the drawing) of its pipe-shaped musical instrument main body 1, a mouthpiece 10 is attached. On the other side (lower end side in the drawing), a sound emitting section 2 is provided, from which musical sounds are emitted. The mouthpiece 10 is provided with at least a blowing pressure sensor that detects the breath pressure of a player's breath blown from a blow-in port of the mouthpiece 10, which will be described later. Also, a loudspeaker 5 that produces sounds is provided in an inner area on the sound emitting section 2 side of the musical instrument main body 1. Also, on one side surface (side surface on the right side of the drawing) of the musical instrument main body 1, a plurality apt fingerhole switches 3 that specify pitches by fingering operations are arranged. On another side (side surface on the front side in the drawing) thereof, an operation section 4 having a power supply switch for the electronic wind instrument 100 and various operation switches for controlling a musical performance status and the like is provided. Although not shown, the musical instrument main body 1 is provided with a control section which controls the interval, volume, tone, and the like of each musical sound to be emitted from the loudspeaker 5, based on various detection signals outputted from the mouthpiece 10, pitch data acquired based on the fingerhole switches 3, and control signals outputted from the operation section 4.

Figure 2:
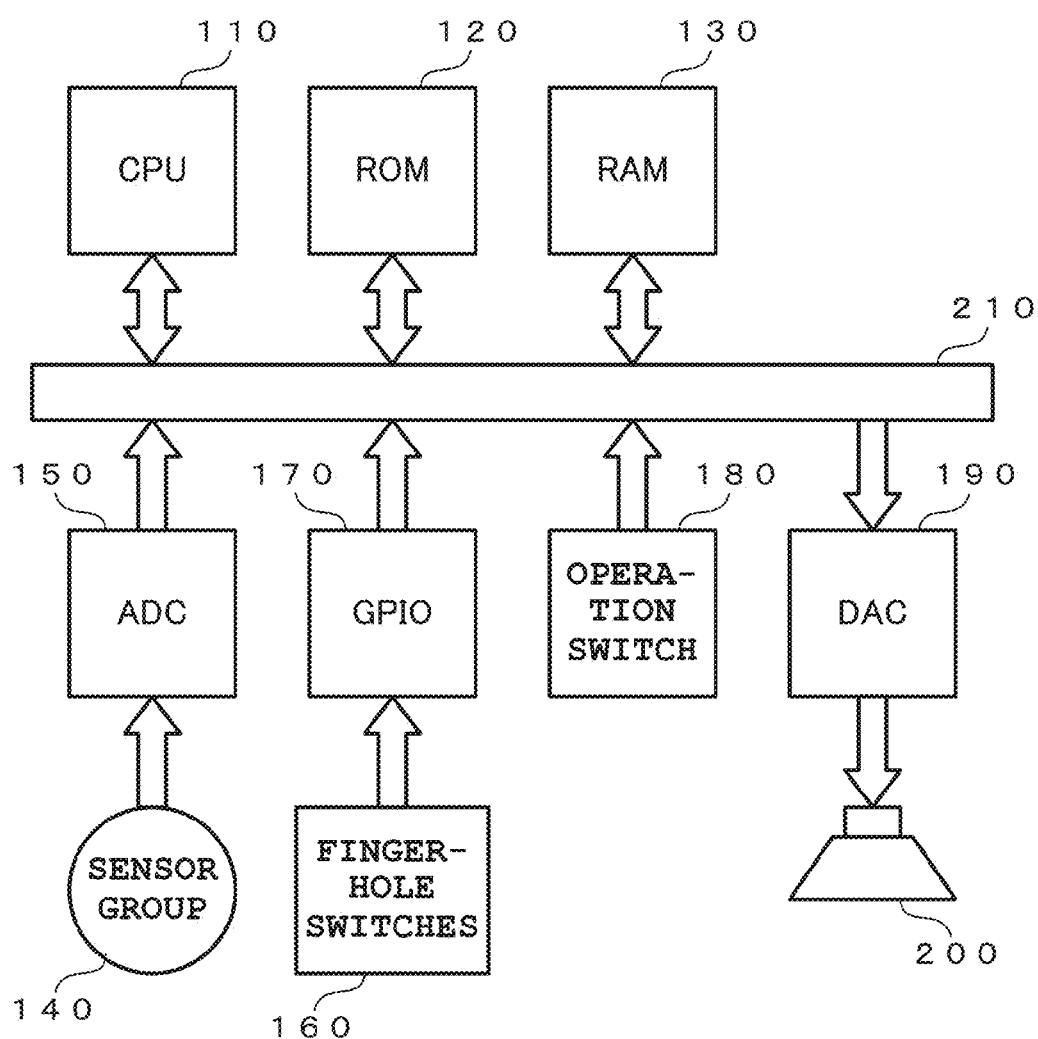
FIG. 2 is a block diagram showing an example of an electric structure of the electronic wind instrument according to the embodiment of the present invention.
Figure 3:
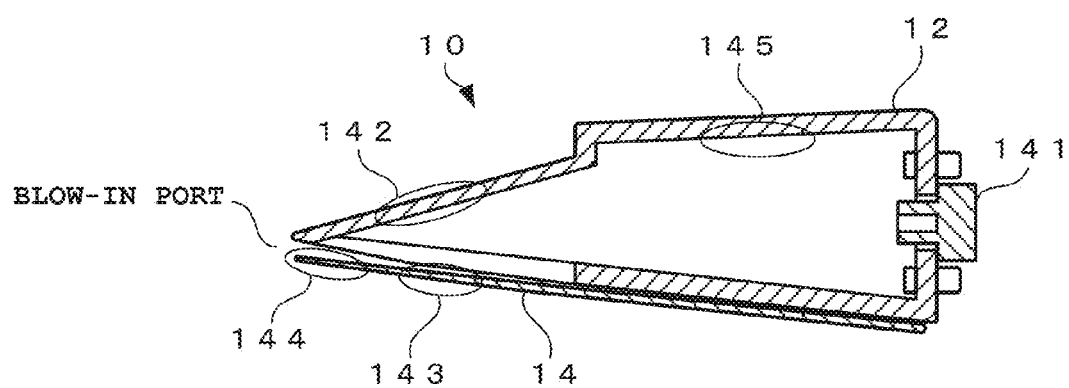
FIG. 3 is a schematic sectional view showing an example of a mouthpiece applied in the electronic wind instrument according to the embodiment of the present invention.

FIG. 2 is a block diagram showing an example of an electric structure of the electronic wind instrument having a musical sound generation apparatus according to the present embodiment, and FIG. 3 is a schematic sectional view showing an example of the mouthpiece applied in the electronic wind instrument according to the present embodiment.

The electronic wind instrument 100 having the musical sound generation apparatus according to the present embodiment mainly includes a CPU (Central Processing Unit) 110, a ROM (Read Only Memory) 120, a RAM (Random Access Memory) 130, a sensor group 140, an ADC (Analog-to-Digital Converter) 150, fingerhole switches 160, a GPIO (General Purpose Input/Output) 170, an operation switch 180, a DAC (Digital-to-Analog Converter) 190, and a sound producing section 200, which are mutually connected via a bus 210, as shown in FIG. 2. Note that the structure shown in the present embodiment is merely an example for achieving the electronic wind instrument according to the present invention and the present invention is not limited thereto.

The CPU (Central Processing Unit) 110 corresponds to the control section described above. By performing a predetermined program stored in the ROM 120, the CPU 110 controls a sound source such that a musical sound with a pitch specified by pitch data acquired based on a fingering operation performed on the fingerhole switches 160 is replayed, and controls the interval, volume, tone, and the like of the musical sound to be replayed, based on various detection signals acquired by the sensor group 140 during the musical performance and control signals outputted from the operation switch 180. In particular, in the present embodiment, based on a physical model blowing pressure acquired by calculation (physical model calculation) using a specific physical model being performed on a blowing pressure acquired by the blowing pressure sensor provided in the mouthpiece 10, the CPU 110 performs control of generating a musical sound with a predetermined volume. Note that the musical sound generation method in the CPU 110 will be described later in detail.

The ROM (Read Only Memory) 120 has stored therein a control program to be executed by the CPU 110 for controlling various operations in the electronic wind instrument 100 during musical performance. In particular, in the present embodiment a sound emission generation program for achieving the musical sound generation method described later has been stored. Also, in the ROM 120, sound source data acquired by recording waveform data of all musical sounds of a specific natural musical instrument or various natural musical instruments has been stored. Here, as the sound source data, PCM (Pulse Code Modulation) sound sources and known various sound sources can be applied.

The RAM (Random Access Memory) 130 sequentially acquires and temporarily stores data generated when the CPU 110 performs a control program and detection signals outputted from the sensor group 140 during musical performance by the electronic wind instrument 100. Note that the above-described sound source stored in the ROM 120 may be stored in the RAM 130.

The sensor group 140 includes various sensors provided in the mouthpiece 10 and the like for detecting a blowing status when the player wears the mouthpiece 10 in the mouth for musical performance. Specifically, for example, a blowing pressure sensor 141, a bite sensor 142, a lip sensor 143, a tongue sensor 144 for detecting the shape of the tongue, a voice sensor 145, and the like are provided on portions of the mouthpiece 10 which has a structure where a mouthpiece main body 12 and a reed 14 have been combined, as shown in FIG. 3.

The blowing pressure sensor 141 detects blowing pressure based on breath blown in from the blowing-in port of the mouthpiece 10. The bite sensor 142 detects a pressure of biting the reed 14 (reed biting force) when the player puts the mouthpiece 10 in the mouth. The lip sensor 143 detects a position of the lip when the player puts the mouthpiece 10 in the mouth. The tongue sensor 144 detects the shape of the tongue based on the status of the tongue when it is in contact with the reed 14. The voice sensor 145 detects the voice of the player emitted using a microphone or the like. Analog voltage values outputted from these sensors 141 to 145 as detection signals are converted by the ADC (Analog-to-Digital Converter) 150 to digital voltage values and loaded into the CPU 110.

The fingerhole switches 160 correspond to the above-described fingerhole switches 3, and output ON/OFF signals in accordance with fingering operations by the player. These ON/OFF signals are loaded into the CPU 110 via the GPIO (General Purpose Input/Output) 170.

The operation switch 180 corresponds to the above-described operation section 4, and outputs a control signal for setting and controlling the tone, volume, and the like of a sound emitted from the sound emitting section 2. This control signal is loaded into the CPU 110. Note that the operation switch 180 may be used to arbitrarily change and set the structure of a physical model and parameter settings described later.

The sound producing section 200 has the above-described loudspeaker 5. A musical sound signal generated by the CPU 110 extracting predetermined waveform data from the sound source stored in the ROM 120 based on pitch data from the fingerhole switches 160 and detection signals from the sensor group is converted by the DAC (Digital-to-Analog Converter) 190 from a digital signal to an analog signal, and then a predetermined musical sound is emitted via the loudspeaker 5.

(Electronic Wind Instrument Control Method)

Next a control method for the electronic wind instrument according to the present embodiment is described. Note that this electronic wind instrument control method includes a musical sound generation method and a program for a musical sound generation apparatus according to the present invention.

Figure 4:
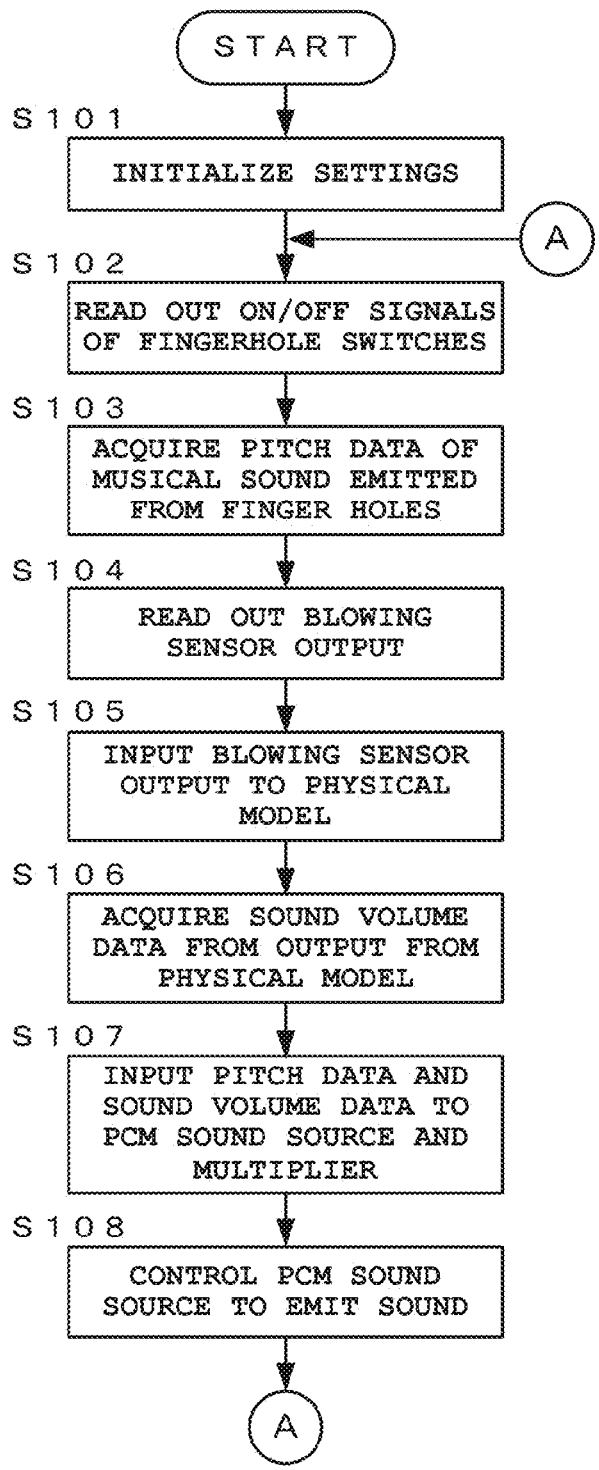
FIG. 4 is a flowchart of a processing operation during musical performance, in the electronic wind instrument according to the embodiment of the present invention.
Figure 5:
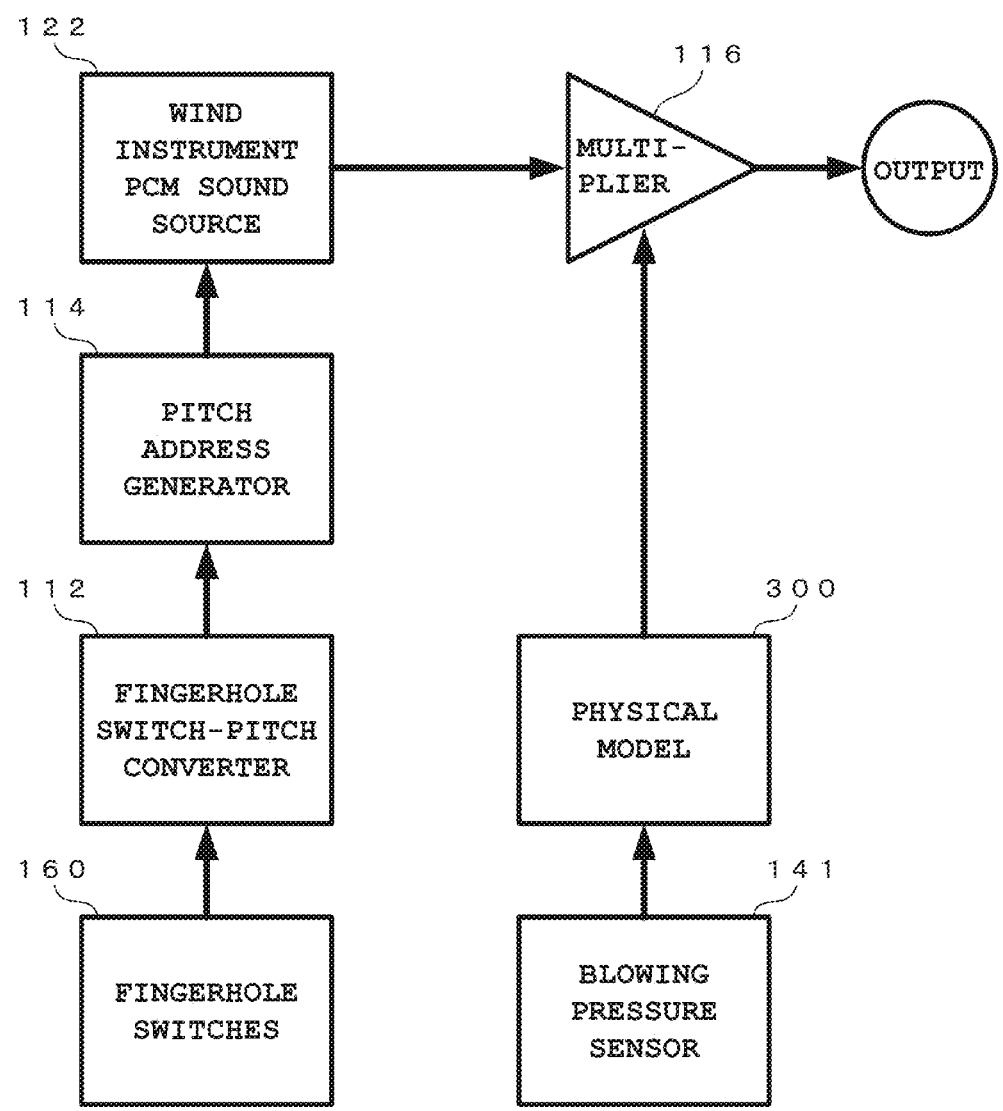
FIG. 5 is a functional block diagram of the processing operation during the musical performance, in the electronic wind instrument according to the embodiment of the present invention.

FIG. 4 is a flowchart of the control method for the electronic wind instrument according to the present embodiment and FIG. 5 is a functional block diagram of the musical sound generation method applied in the electronic wind instrument according to the present embodiment.

The method of controlling the electronic wind instrument according to the present embodiment is achieved by the CPU 110 of the above-described electronic wind instrument 100 executing a control program including a specific musical sound generation program.

In processing operations in the electronic wind instrument during musical performance, for example, plural operations are performed at the timing of the musical performance, such as an operation of reading out, from the sound source, a musical sound with a pitch specified in accordance with a fingering operation performed on the fingerhole switches 160 by the player and replaying it, and an operation of controlling the sound volume of the musical sound read and replayed from the sound source based on a physical model blowing pressure acquired by calculation using a specific physical model being performed on a blowing pressure given by the player blowing a breath into the mouthpiece 10, as shown in FIG. 4 and FIG. 5.

Specifically, after the settings of the electronic wind instrument 100 are initialized (Step S101), the player first operates the fingerhole switches 160 to specify a desired pitch. As a result, the CPU 110 reads out ON/OFF signals from the fingerhole switches 160 via the GPIO 170 (Step S102).

Next, based on the read ON/OFF signals of the fingerhole switches 160, the CPU 110 causes a fingerhole-switch-pitch converter 112 configured by software to acquire pitch data which defines the pitch of a musical sound to be emitted, with reference to a reference table (wave table) that uniquely determines which sound is to be emitted (Step S103).

Next, the CPU 110 causes a pitch address generator 114 configured by software to generate an address for the acquired pitch data. Specifically, the CPU 110 determines a musical sound to be replayed by setting, to an address, the ratio (scale factor) of the determined pitch frequency with respect to the frequency of a reference sound.

On the other hand, by the player putting the mouthpiece 10 in the mouth and blowing a breath from the blow-in port at the timing of operating the fingerhole switches 160 as described above, the CPU 110 reads out a voltage value corresponding to a blowing pressure detected by the blowing pressure sensor 141 via the ADC 150 (Step S104).

Next, the CPU 110 performs calculation (physical model calculation) where a physical model 300 configured by software has been applied so as to calculate a physical model blowing pressure with a predetermined change characteristic (Step S105), and acquires this calculation output as sound volume data (Step S106).

Next, based on the pitch address of the musical sound determined at Step S103, the CPU 110 reads out relevant waveform data stored in the ROM 120 from a PCM sound source 122, and inputs the read waveform data to a multiplier 116. Also, in synchronization with this timing, the CPU 110 inputs the sound volume data acquired at Step S106 to the multiplier 116 (Step S107).

Next, for the waveform data inputted from the PCM sound source 122, the multiplier 116 generates a musical sound signal with a sound volume set in accordance with the change characteristic of the sound volume data acquired by the calculation using the physical model 300, and outputs the musical sound signal to the sound producing section 200 via the DAC 190. As a result, the musical sound with the pitch in accordance with the fingering operation on the fingerhole switches 160 is emitted from the loudspeaker 5 with the sound volume in accordance with the change characteristic based on the physical model 300 (Step S108). Hereafter, by the CPU 110 repeatedly performing the processing at Step S102 to Step S108 described above, musical sounds are consecutively emitted from the loudspeaker 5 to perform a musical piece.

Note that, although omitted in the flowchart shown in FIG. 4, the CPU 110 forcibly ends a processing operation when a status change, such as the end or discontinuance of the musical performance, is detected during the above-described series of processing operations (Steps S101 to S108).

(Physical Model)

Next, a physical model applied in the electronic wind instrument control method (musical sound generation method) according to the present embodiment is specifically described. Here, for simplification of description, the most simplified physical model (having a structure where one weight is supported by two springs) is presented. However, a more complex physical model (having a structure where a plurality of weights are supported by a plurality of springs) may be applied.

Figure 6:
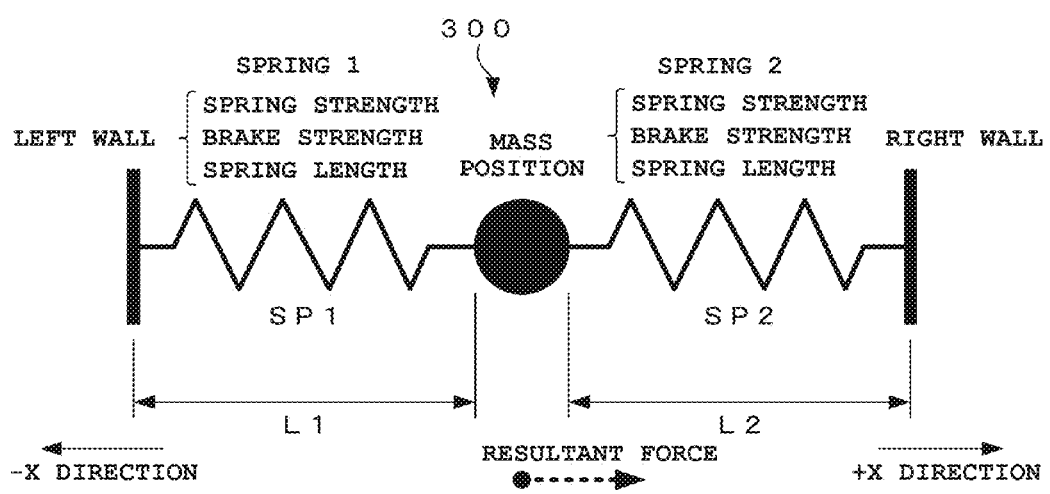
FIG. 6 is a conceptual diagram showing an example of a physical model applied in sound volume control processing by the electronic wind instrument according to the embodiment of the present invention.

FIG. 6 is a conceptual diagram showing an example of the physical model applied in the electronic wind instrument control method (musical sound generation method) according to the present embodiment.

The physical model 300 applied in the present embodiment is a virtual model configured by software by the CPU 110 executing a specific program, in which, for example, a weight (mass body) is supported by two springs SP1 and SP2 connected in series on both left and right sides between a pair of fixed walls (a left wall and a right wall) arranged opposing each other and positioned a predetermined distance away from each other toward a ±X direction (lateral direction in the drawing), as shown in FIG. 6. In the present embodiment, in this physical model 300, the change characteristic of the position of the weight when a force in accordance with a blowing pressure detected by the blowing pressure sensor 141 is applied to the weight in an initial stationary state is given to the blowing pressure, and a physical model blowing pressure acquired thereby is used as sound volume data for controlling the sound volume of a musical sound.

Figure 7:
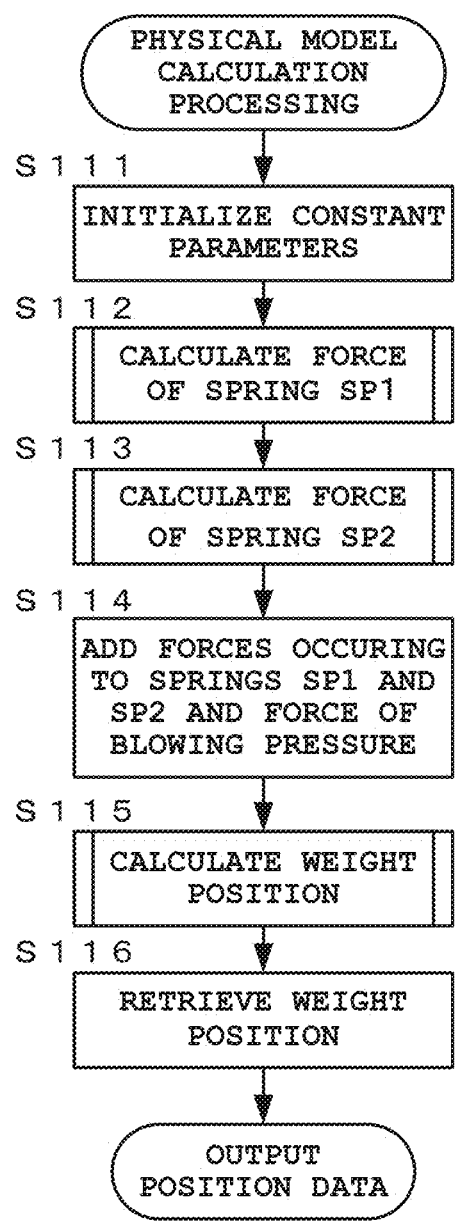
FIG. 7 is a flowchart showing an example of the entire processing of calculating the physical model applied in the embodiment.
Figure 8:
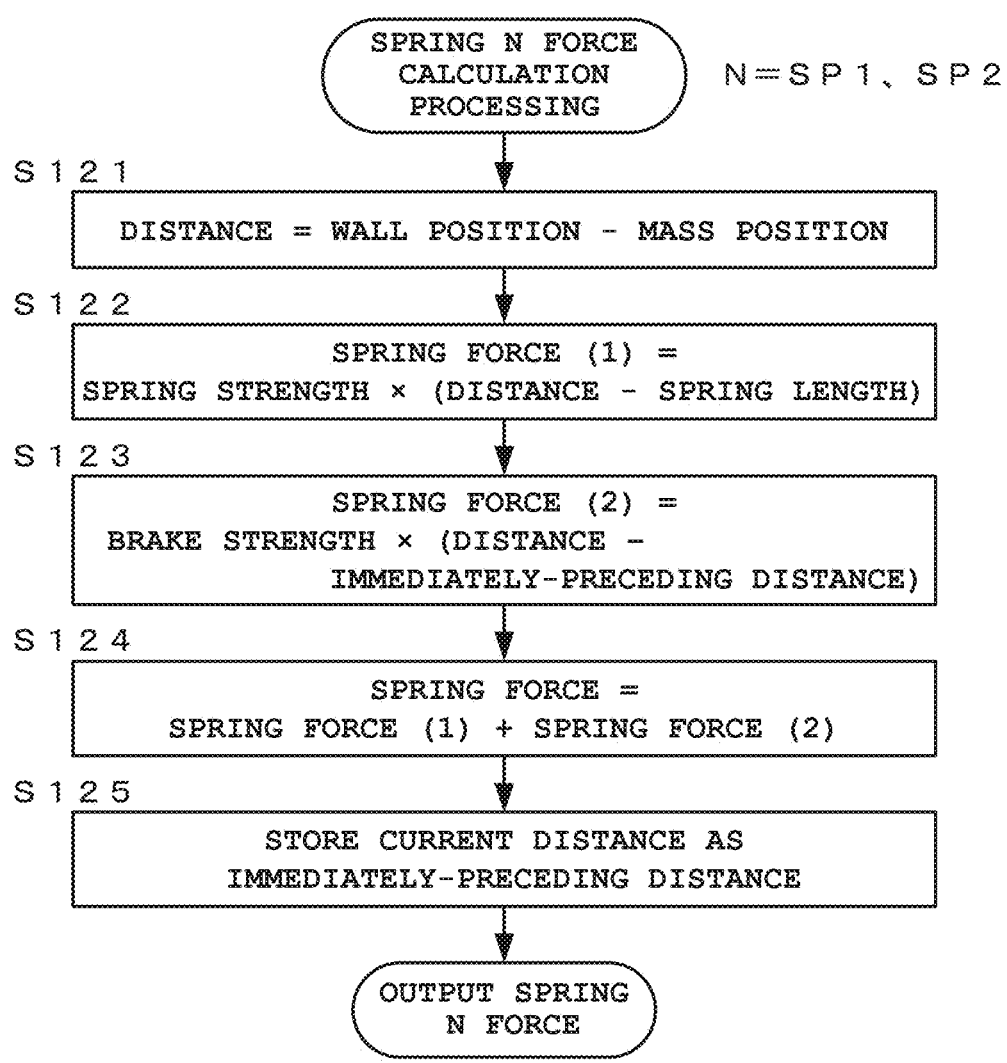
FIG. 8 is a flowchart showing an example of processing of calculating the spring force of the physical model applied in the embodiment.

FIG. 7 is a flowchart showing an example of calculation processing for the physical model applied in the present embodiment, and FIG. 8 is a flowchart showing an example of processing of calculating a spring force in the physical model applied in the present embodiment. FIG. 9 is a flowchart showing an example of processing of calculating the position of the weight in the physical model applied in the present embodiment.

A change in the position of the weight when a force is applied to the stationary weight is found by a series of calculation processing as described below.

First, when an equation of motion (13) is rewritten by using physical general equations (11) and (12) regarding velocity and acceleration, the position x(t) of the weight with mass m at time t is represented as Equation (14).

VELOCITY: $v(t)=x(t)-x(t-1)$; (11)

ACCELERATION: $a(t)=v(t)-v(t-1)=x(t)-2*x(t-1)+x(t-2)$; (12)

EQUATION OF MOTION: $f=m*a(t)$; (13)

WEIGHT POSITION: $x(t)=f/m+2*x(t-1)-x(t-2)$ (14)

In Equations (11) to (14) described above, x(t), x(t−1), and x(t−2) are the positions of the weight at times t, t−1, and t−2, respectively; v(t) and v(t−1) are the velocities of the weight at times t and t−1, respectively; a(t) is the acceleration of the weight at time t; and f is a force applied to (or occurring in) the weight.

On the other hand, a restoring force occurs in a spring to a direction opposite to a direction in which an external pressure is applied. This restoring force is defined by spring constant k. Also, oscillation when the spring is restored is attenuated while depending on friction coefficient (attenuation coefficient) d, and the spring is eventually returned to a stationary state. In the physical model 300 applied in the present embodiment, since the weight is supported by the two springs SP1 and SF2 connected on the left and right sides, forces f1 and f2 occurring in the springs SP1 and SF2 are represented by Equations (15).

Forces Occurring in the Springs $$\left. \begin{array}{l} f1 = k*(x(t)-L1) + d*(x(t)-x(t-1)) \\ f2 = k*(x(t)-L2) + d*(x(t)-x(t-1)) \end{array} \right\} \quad (15)$$

In each of the above-described Equations (15), the first term on the right side represents a restoring force, and the second term thereon represents the oscillation of the spring. Also, L1 and L2 represent the length of the spring SP1 and the length of the spring SP2, respectively, with the weight connected by the two springs SP1 and SF2 between the left wall and the right wall being in a stationary state, and correspond to a distance between the left wall and the weight and a distance between the right wall and the weight, respectively.

In the physical model 300 applied in the present embodiment, force f given to the weight is equivalent to a force acquired by adding forces f1 and f2 occurring in the springs SP1 and SP2 and force fv corresponding to blowing pressure. Accordingly, a relation represented by Equation (16) makes sense.

Relational Expression of Forces in the Physical Model:

$$f = f1 + f2 + fv \quad (16)$$

In the present embodiment, based on the above-described relation, the calculation processing described below is repeatedly performed at a predetermined sampling frequency (for example, an interval of 10 ms) as necessary so as to calculate the position of the weight.

In physical model calculation processing, for example, the CPU 110 first initializes constant parameters for the physical model 300 (Step S111), as shown in the flowchart of FIG. 7. Here, the constant parameters of the physical model 300 includes the mass of the weight, the strengths of the springs SP1 and SP2 (repulsive forces against external pressure based on sprint constants), the lengths of the springs SP1 and SP2, brake forces (forces acting when the oscillation of the spring is attenuated based on a coefficient of friction or coefficient of attenuation), and the position of each spring-fixed wall. In the initialisation, the CPU 110 sets these parameters at fixed values (constants). Note that the strengths and lengths of the springs SP1 and SP2 are variables varying in accordance with the position of the weight.

Next, based on Equations (15), the CPU 110 calculates force f1 occurring in the spring SP1 and force f2 occurring in the spring SP2 (Steps S112 and S113). Specifically, for example, in processing of calculating the force of each spring N (N=SP1, SP2), the CPU 110 first subtracts, for each spring N, the position of the weight from the position of the left wall serving as a reference (base point 0) to calculate a current distance between the wall and the weight and stores the current distance in a register (Step S121).

Next, the CPU 110 calculates an element (spring force (1)) related to the strength of the spring based on spring constant k represented in the first term on the right side of each of Equations (15) and an element (spring force (2)) related to the brake strength of the spring based on friction coefficient d represented in the second term on the right side of each of Equations (15). The CPU 110 acquires spring force (1) by multiplying the strength of the spring N and the result (spring expansion distance) of subtracting the length of the spring N (constant; L1, L2) from the current distance calculated at Step S121 (Step S122). Also, the CPU 110 acquires spring force (2) by multiplying the brake strength of the spring N (friction coefficient or attenuation coefficient; d) and the result (difference in distance) of subtracting an immediately-preceding distance (that is, a distance preceding to the current distance by one sampling time) from the current distance calculated at Step S121 (Step S123).

Next, the CPU 110 adds spring forces (1) and (2) calculated at Steps S122 and S123 to calculate the current force (f1, f2) of the current spring N (Step S124). Also, for use in calculating the force of the spring N at the next sampling time, the CPU 110 also stores the current distance calculated at Step S121 as an immediately-preceding distance (preceding by one sampling time) in the RAM 130 (Step S125).

By performing the above-described series of processing for calculating the force of the spring N (N=SP1, SP2) for each of the springs SP1 and SP2, the CPU 110 calculates and outputs forces f1 and f2 occurring to the spring N at a current weight position (Steps S112 and S113).

Next, returning to the flowchart of FIG. 7, the CPU 110 adds, based on the above-described Equation (16), forces f1 and f2 calculated at Steps S112 and S113 and force fv corresponding to the blowing pressure to calculate force f applied to the weight (Step S114).

Next, based on the above-described Equation (14), the CPU 110 calculates the position of the weight by giving force f calculated at Step S114 to the weight (Step S115). Specifically, for example, in processing of calculating the position of the weight, the CPU 110 first calculates a force applied to the weight of the first term on the right side in the above-described Equation (14), an element (weight position (1)) related to the mass, and an element (weight position (2)) related to the positions of the weight at the immediately-preceding sampling time (t−1) and the sampling time immediately preceding thereto (t−2) represented in the second and third terms thereon, respectively, as shown in the flowchart of FIG. 9. Also, the CPU 110 acquires weight position (1) by dividing force f applied to the weight calculated at Step S114 by mass m (Step S131). Moreover, the CPU 110 acquires weight position (2) by adding (or subtracting) a position (x−(t−2)) previous to the current position of the weight by two sampling times to (or from) a double of a position (x(t−1)) previous to the current position of the weight by one sampling time (immediately-preceding position) (Step S132).

Next, the CPU 110 adds positions (1) and (2) of the weight calculated at Steps S131 and S132 to calculate the current position (x(t)) of the weight (Step S133). Also, for use in the calculation of the position of the weight at the next sampling time, the CPU 110 stores the immediately-preceding position of the weight as a position preceding by two sampling times in the RAM 130 (Step S134), and stores the current position of the weight calculated at Step S133 as an immediately-preceding position in the RAM 130 (Step S135).

By the above-described series of processing for calculating the position of the weight, the CPU 110 calculates and outputs the current position of the weight (Step S115). Here, the position of the weight calculated at Step S133 continuously varies with the elongation and contraction of the springs SP1 and SP2 connected to the weight. Since the weight is moved from the position used in the above-described calculation of the force of the spring N, the distance calculated at Step S121 is changed and forces f1 and f2 occurring to the spring N are changed. As a result, force f applied to the weight is further changed at Step S131, and the position of the weight is also further changed.

By repeatedly performing this series of calculation of the force of the spring N and the position of the weight at the predetermined sampling frequency, the CPU 110 sequentially retrieves the position of the weight for each sampling time (Step S116), and outputs the position as position data. The change characteristic of this position data is given to a blowing pressure detected by the blowing pressure sensor 141 in physical model calculation, and a physical model blowing pressure is outputted. Then, as shown in Step S106 and Step S107, the CPU 110 acquires this output as sound volume data, which is used for the sound volume control of the PCM sound source 122 at the multiplier 116.

(Change Characteristic of Sound Volume Data)

Next, the change characteristic of physical model blowing pressure acquired by calculation (physical model calculation) using the above-described physical model is described. This change characteristic of physical model blowing pressure corresponds to the change characteristic of sound volume data.

Figure 10A:
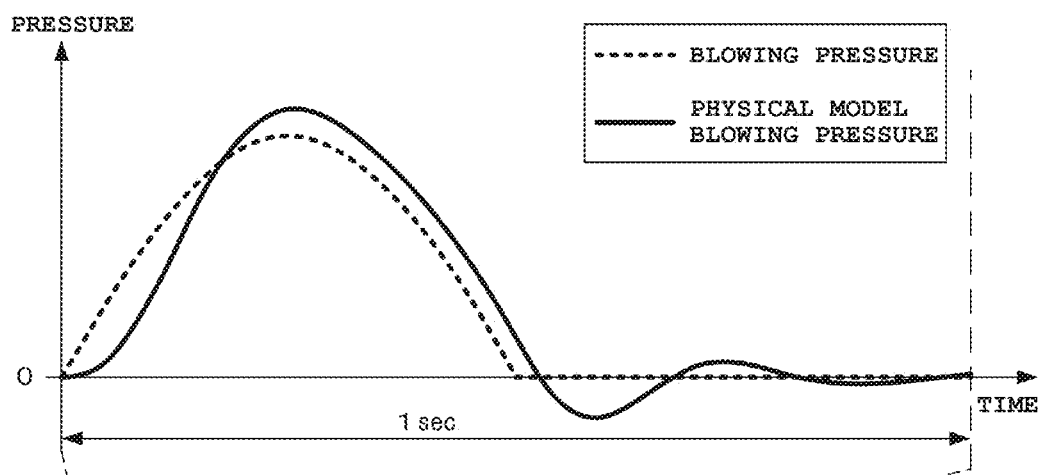
Figure 10B:
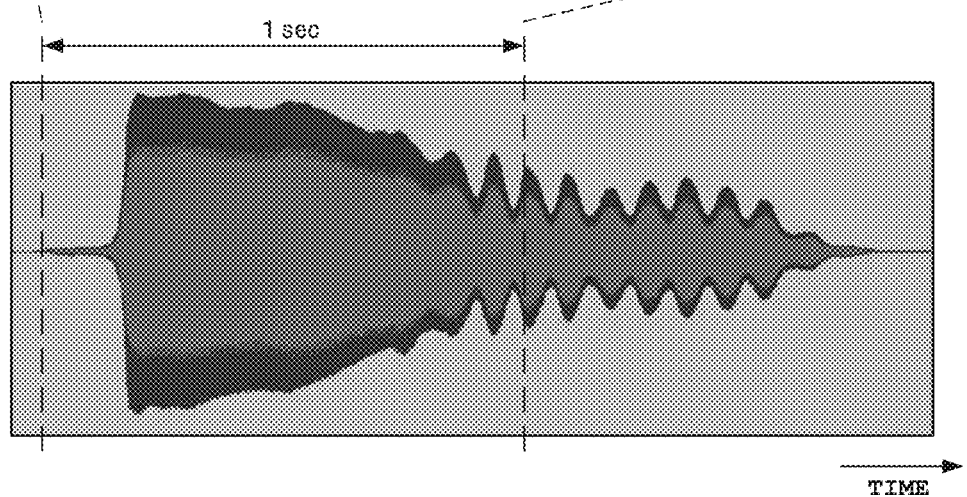

FIG. 10A and FIG. 10B are diagrams for comparing the change characteristic of a physical model blowing pressure calculated by the physical model calculation applied in the present embodiment and waveform data representing sound volume changes in a natural musical instrument. Here, FIG. 10A is a characteristic diagram showing changes in a physical model blowing pressure with respect to a blowing pressure, and FIG. 10B is a diagram showing waveform data (envelope) indicating sound volume changes in a musical sound outputted from a natural musical instrument (saxophone). In the characteristic diagram in FIG. 10A, the vertical axis represents a relative relation in the magnitude of pressure changes, and the pressure "0" represents a state of no sound emission with no blow pressure. Also, the horizontal axis in the characteristic diagram represents a lapse of time. The range in the horizontal axis shown in FIG. 10A is approximately one second, and the range in the horizontal axis in FIG. 10B is approximately two seconds.

In the physical model 300 where the weight and the springs SP1 and SP2 have been connected in series as shown in FIG. 6, force fv corresponding to a blowing pressure detected by the blowing pressure sensor 141 is applied to the weight in a connecting direction (±X direction) of the physical model 300 for movement, and then released. As a result, by the restoring forces of the springs SP1 and SP2, the weight makes oscillating motions and reciprocates in the +X direction and the −X direction. Then, the oscillation is gradually attenuated and, eventually, the weight becomes stationary at an initial position.

Here, in general, in the electronic wind instrument 100, blowing pressure detected by the blowing pressure sensor 141 abruptly increases at substantially the same time as the player starts blowing a breath into the mouthpiece 10. Then, when the maximum point (peak) is reached, the blowing pressure abruptly decreases, and becomes 0 at substantially the same time as the player ends the blowing, as indicated by a dotted curve in FIG. 10A.

For these changes of the blowing pressure, the above-described physical model blowing pressure provided with the change characteristic of a weight position acquired by calculation processing using the physical model 300 delays with respect to the blowing pressure at the start of the blowing of the breath, demonstrates a more abrupt increase tendency than the changes of the blowing pressure, and exceeds (overshoots) the maximum point of the blowing pressure, as shown by a solid curve in FIG. 10A. In addition, even after the player ends the blowing to cause the blowing pressure to become 0, the physical model blowing pressure continues attenuated oscillation, and then converges to 0, as with the motion of the weight in the physical model 300.

Specifically, for example, in one second that is the total range of the lapse of time shown in FIG. 10A, when the player blows a breath into the mouthpiece 10 for approximately 0.5 seconds, a physical model blowing pressure outputted slightly later than the start of the blowing (detection of a blowing pressure) demonstrates a change characteristic of continuously making attenuated oscillation for an approximately 0.5 seconds even after the end of the blowing (non-detection of a blowing pressure). Accordingly, in the present embodiment, a physical model blowing pressure is calculated by providing a delay and attenuated oscillation to timing at which the player blows a breath and its blowing pressure by calculation using the physical model 300, and this physical model blowing pressure is inputted to the multiplier 116 as sound volume data. As a result, a musical sound replayed from the PCM sound source 122 is controlled to have a sound volume in accordance with the above-described change characteristic for emission.

Also, it has been found that, when the change characteristic of a physical model blowing pressure calculated by the physical model calculation applied in the present embodiment is compared with the waveform data of the sound volume of a natural musical instrument, even if a simple physical model such as that shown in FIG. 6 is applied, the delay and the change characteristic of attenuated oscillation provided to the physical model blowing pressure that serves as sound volume data can be made similar to the delay and attenuated oscillation included in the waveform data of the sound volume of the natural musical instrument, as shown in FIG. 10A and FIG. 10B.

As such, in the present embodiment, calculation processing using a specific physical model is performed on changes in the blowing pressure of a breath blown into the mouthpiece 10, whereby sound volume data provided with a delay and attenuated oscillation is acquired. Then, at timing at which a musical sound with a pitch specified by a fingering operation on the fingerhole switches 160 is read and replayed, the sound volume of the musical sound is controlled based on the change characteristic of the sound volume data.

As a result of this configuration, in the present embodiment, a blowing feeling close to that of a natural musical instrument can be achieved as compared to a method where a blowing pressure is directly used for sound volume control. In particular, in the present embodiment, the structure (such as the number of springs and weights) and the parameters (such as the mass of the weighty the strength and length of each spring, brake strength, and wall positions) of the physical model 300 for acquiring sound volume data are changed and set by, for example, the player operating the operation switch 180 of the operation section 4 or the like, whereby the sound volume can be controlled with an arbitrary change characteristic. As a result of this configuration, a blowing feeling close to that of a natural musical instrument or a favorite blowing feeling can be relatively easily achieved.

In the above-described embodiment, the electronic wind instrument 100 having an outer shape of a saxophone type has been described. However, the electronic wind instrument according to the present invention is not limited thereto, may be an electronic instrument having an outer shape of a clarinet or trumpet type acoustic wind instrument or an electronic instrument such as a keyboard harmonica having a blowing pressure sensor in an electronic keyboard as long as it has a structure where blowing pressure is detected during musical performance so as to control the sound volume of musical sound to be emitted.

Also, in the above-described embodiment, the control section for performing various control operations is configured such that the CPU (general-purpose processor) executes a program stored in the ROM (memory). However, a configuration may be adopted in which the plurality of control operations are divided and performed by respective dedicated processors. In this case, each dedicated processor may be constituted by a general-purpose processor (electronic circuit) that can execute an arbitrary program and a memory having stored thereon a control program tailored to its control, or may be constituted by a dedicated electronic circuit tailored to its control.

In the case of the configuration where the CPU (general-purpose processor) executes a program stored in the ROM (memory), the CPU performs processing and the program, as the following examples.

Configuration Example 1

The CPU performs calculation of providing attenuated oscillation to a first blowing pressure detected by a blowing pressure sensor which detects blowing pressure, and generates a musical sound based on a second blowing pressure acquired by the calculation being performed on the first blowing pressure.

Configuration Example 2

The above-described configuration example 1, in which the calculation is to convert a first blowing pressure change that is a temporal change of each blowing pressure sequentially detected by the blowing pressure sensor to a second blowing pressure change acquired by attenuated oscillation being provided to the first blowing pressure change, and the CPU generates the musical sound based on the second blowing pressure change.

Configuration Example 3

The above-described configuration example 1, in which the CPU controls a sound volume of the musical sound which is replayed with a specified pitch during musical performance, based on the second blowing pressure acquired by the calculation being performed on the first blowing pressure detected in the musical performance.

Configuration Example 4

The above-described configuration example 1 in which the calculation is to provide a delay and the attenuated oscillation to a blowing pressure.

Configuration Example 5

The above-described configuration example 2, in which the calculation is to convert the first blowing pressure change to the second blowing pressure change such that a first blowing pressure detected by the blowing pressure sensor at first timing continues the attenuated oscillation after second timing which comes later than the first timing and at which the first blowing pressure is no longer detected.

Configuration Example 6

The above-described configuration example 1, in which the calculation is physical model calculation based on a physical model where a delay and attenuated oscillation have been taken into consideration.

Configuration Example 7

The above-described configuration example 6, in which the physical model is a physical model simplified more than a physical model corresponding to a structure of a wind instrument.

Configuration Example 8

The above-described configuration example 6 in which the delay and the attenuated oscillation to be provided to the first blowing pressure are changeable by parameters defining the physical model being changed.

Configuration Example 9

The above-described configuration example 7, in which the physical model corresponds to a weight connected to a spring and the physical model calculation is performed by software of a computer based on the physical model, calculates a positional change of the weight which occurs when a force corresponding to a blowing pressure is applied to the weight and provides the delay and the attenuated oscillation corresponding to the calculated positional change to the blowing pressure.

Configuration Example 10

The above-described configuration example 9, in which the physical model has a structure where one or a plurality of weights have been connected in series and supported by a plurality of resilient bodies between a pair of fixed walls arranged opposing each other and positioned a predetermined distance away from each other toward a specific direction.

Configuration Example 11

The above-described configuration example 9, in which the physical model has at least one of parameters related to a mass of the weight strengths of the resilient bodies, lengths of the resilient bodies, brake strengths of the resilient bodies, and positions of the fixed walls, and the delay and the attenuated oscillation to be provided to the blowing pressure are changeable by one or more of the parameters being changed.

Also, in the case of the configuration where a plurality of dedicated processors are provided, the number of dedicated processes to which the plurality of control operations are assigned and how the plurality of control operations are assigned thereto may be arbitrarily determined. Configuration examples where the plurality of control operations are divided and assigned to a plurality of dedicated processors are described below.

Configuration Example 12

A configuration including a blowing pressure sensor which detects a blowing pressure; a blowing pressure processor which calculates a physical model blowing pressure by performing physical model calculation of providing attenuated oscillation to the blowing pressure detected by the blowing pressure sensor during musical performance; and a musical sound generation processor which generates a musical sound based on the physical model blowing pressure.

Configuration Example 13

The above-described configuration example 12, in which the musical sound generation processor includes a sound source processor which replays the musical sound with a specified pitch in the musical performance, and a sound volume control processor which controls a sound volume of the musical sound replayed from the sound source processor by using the physical model blowing pressure as sound volume data, based on the attenuated oscillation provided to the physical model blowing pressure.

Configuration Example 14

The above-described configuration example 12 in which the physical model calculation is to provide a delay and the attenuated oscillation to the blowing pressure.

Configuration Example 15

The above-described configuration example 12, in which the blowing pressure processor performs the physical model calculation to provide the blowing pressure with a change characteristic where the attenuated oscillation continues after timing which comes later than timing of detection of the blowing pressure by the blowing pressure sensor and at which the blowing pressure is no longer detected.

Configuration Example 16

The above-described configuration example 14, in which a physical model applied in the physical model, calculation is a virtual model configured by software of a computer, and has a structure where one or a plurality of weights have been connected in series and supported by a plurality of resilient bodies between a pair of fixed walls arranged opposing each other and positioned a predetermined distance away from each other toward a specific direction; and the blowing pressure processor provides to the blowing pressure a change characteristic of a position of the weight when a force corresponding to the blowing pressure is applied to the weight of the physical model, as the delay and the attenuated oscillation.

Configuration Example 17

The above-described configuration example 16, in which the physical model has parameters related to a mass of the weight strengths of the resilient bodies, lengths of the resilient bodies, brake strengths of the resilient bodies, and positions of the fixed walls, and a change characteristic of sound volume data is changeable by one or more of the parameters being changed.

While the present invention has been described with reference to the preferred embodiments, it is intended that the invention be not limited by any of the details of the description therein but includes all the embodiments which fall within the scope of the appended claims.

What is claimed is:

1. A musical sound generation method comprising:
   acquiring a first blowing pressure detected by a blowing pressure sensor;
   performing a physical model calculation by a processor based on parameters stored in a memory and the first blowing pressure, the parameters defining a physical model corresponding to a weight connected to a spring, one end of which is fixed; and
   generating a musical sound based on a second blowing pressure obtained by performing the physical model calculation,
   wherein performing the physical model calculation comprises:
   initializing the parameters;
   calculating a first force generated in the spring at a current position of the weight;
   calculating a third force applied to the weight by adding the first force to a second force corresponding to the first blowing pressure;
   calculating a new position of the weight changed by the third force being applied to the weight;
   repeatedly executing a series of calculations including the calculation of the third force and the calculation of the new position of the weight at certain sampling intervals; and
   calculating the second blowing pressure based on the position of the weight calculated at the certain sampling intervals.

2. The musical sound generation method according to claim 1, further comprising:
   controlling a sound volume of the musical sound which is replayed with a specified pitch during musical performance, based on the second blowing pressure obtained by the physical model calculation being performed on the parameters and the first blowing pressure detected in the musical performance.

3. A non-transitory computer-readable non-volatile storage medium having stored thereon a program that is executable by a computer to perform the musical sound generation method according to claim 1.

4. The musical sound generation method according to claim 1, wherein the physical model calculation is performed by software of a computer based on the parameters stored in the memory and the first blowing pressure.

5. The musical sound generation method according to claim 1, wherein the parameters define the physical model corresponding to a structure where the weight is connected in series to and is supported by a plurality of resilient bodies between a pair of fixed walls arranged opposing each other and positioned a predetermined distance away from each other along a specific direction.

6. The musical sound generation method according to claim 1, wherein the parameters include a mass m of the weight, a spring constant k of the spring, a force f occurring to the spring, and a length of the spring L, and wherein the physical model calculation is a calculation performed based on a calculation equation for calculating a position x(t) of the weight at a time t which includes the parameters.

7. The musical sound generation method according to claim 6, wherein the physical model is a physical model where a delay and an attenuated oscillation have been taken into consideration in an oscillation of the weight,
wherein the parameters further include an attenuation coefficient d which corresponds to friction occurring in the oscillation of the weight, and
wherein performing the physical model calculation comprises performing a calculation to simulate a state where the oscillation of the weight started by the first blowing pressure being applied is attenuated based on the attenuation coefficient d.

8. The musical sound generation method according to claim 7, wherein the physical model calculation converts a first blowing pressure change to a second blowing pressure change such that a first blowing pressure detected by the blowing pressure sensor at a first timing continues the attenuated oscillation after a second timing which comes later than the first timing and at which the first blowing pressure is no longer detected.

9. The musical sound generation method according to claim 7, wherein the delay and the attenuated oscillation are changeable by the parameters being changed.

10. A musical sound generation apparatus comprising:
a blowing pressure sensor which detects a first blowing pressure during musical performance;
a memory which stores parameters defining a physical model corresponding to a weight connected to a spring, one end of which is fixed; and
a processor which performs a physical model calculation based on the parameters stored in the memory and the first blowing pressure, and which generates a musical sound based on a second blowing pressure obtained by performing the physical model calculation,
wherein performing the physical model calculation comprises:
initializing the parameters;
calculating a first force generated in the spring at a current position of the weight;
calculating a third force applied to the weight by adding the first force to a second force corresponding to the first blowing pressure;
calculating a new position of the weight changed by the third force being applied to the weight;
repeatedly executing a series of calculations including the calculation of the third force and the calculation of the new position of the weight at certain sampling intervals; and
calculating the second blowing pressure based on the position of the weight calculated at the certain sampling intervals.

11. The musical sound generation apparatus according to claim 10, wherein the processor replays the musical sound with a specified pitch in the musical performance, and controls a sound volume of the musical sound which is replayed by using the second blowing pressure as sound volume data.

12. The musical sound generation apparatus according to claim 10, wherein the physical model calculation is performed by software of a computer based on the parameters stored in the memory and the first blowing pressure.

13. The musical sound generation apparatus according to claim 10, the parameters include a mass m of the weight, a spring constant k of the spring, a force f occurring to the spring, and a length of the spring L, and
wherein the physical model calculation is a calculation performed based on a calculation equation for calculating a position x(t) of the weight at a time t which includes the parameters.

14. The musical sound generation apparatus according to claim 13, wherein the physical model is a physical model where a delay and an attenuated oscillation have been taken into consideration in an oscillation of the weight,
wherein the parameters further include an attenuation coefficient d which corresponds to friction occurring in the oscillation of the weight, and
wherein performing the physical model calculation comprises performing a calculation to simulate a state where the oscillation of the weight started by the first blowing pressure being applied is attenuated based on the attenuation coefficient d.

* * * * *